United States Patent
Hoang et al.

(10) Patent No.: US 7,429,897 B1
(45) Date of Patent: Sep. 30, 2008

(54) WIDE OPERATING-FREQUENCY RANGE VOLTAGE CONTROLLED OSCILLATORS

(75) Inventors: Tim Tri Hoang, San Jose, CA (US); Sergey Shumarayev, San Leandro, CA (US); Wilson Wong, San Francisco, CA (US)

(73) Assignee: Altera Corporation, San Jose, CA (US)

( * ) Notice: Subject to any disclaimer, the term of this patent is extended or adjusted under 35 U.S.C. 154(b) by 8 days.

(21) Appl. No.: 11/514,489

(22) Filed: Aug. 31, 2006

(51) Int. Cl.
*H03B 5/08* (2006.01)

(52) U.S. Cl. .......................... 331/57; 331/185; 331/173

(58) Field of Classification Search .................. 331/57, 331/185, 173
See application file for complete search history.

(56) References Cited

U.S. PATENT DOCUMENTS

| | | | | |
|---|---|---|---|---|
| 6,809,605 B2* | 10/2004 | Ogawa et al. | ............... | 331/173 |
| 6,825,732 B2* | 11/2004 | Motoyama | ................... | 331/57 |
| 7,205,854 B2* | 4/2007 | Liu | .............................. | 331/57 |
| 2004/0263200 A1* | 12/2004 | Persun et al. | ................ | 324/768 |
| 2005/0046497 A1* | 3/2005 | Nakanishi | ..................... | 331/57 |
| 2006/0103478 A1* | 5/2006 | Brown et al. | ................... | 331/57 |

OTHER PUBLICATIONS

U.S. Appl. No. 11/437,558.

\* cited by examiner

*Primary Examiner*—Joseph Chang
(74) *Attorney, Agent, or Firm*—Ropes & Gray LLP

(57) ABSTRACT

Voltage controlled oscillator (VCO) circuitry with low phase noise and a wide range of operating frequencies is presented. The VCO circuitry includes circuitry with two or more VCO sub-circuits, each sub-circuit being optimized to produce output clock signals with low phase noise and with frequencies in a different range. Sub-circuits with gear inputs may be operative to produce output clock signals in a lower range of frequencies, while sub-circuits optimized for high speed operation may be used to produce output signals in a higher range of frequencies. A control circuit may be used to produce a control signal coupled to all sub-circuits. The control signal may set the operating frequency of the sub-circuits.

18 Claims, 6 Drawing Sheets

WIDE OPERATING-FREQUENCY RANGE VOLTAGE CONTROLLED OSCILLATORS

BACKGROUND OF THE INVENTION

This invention relates to voltage-controlled oscillator (VCO) circuitry. More particularly, this invention relates to voltage-controlled oscillator circuitry operative to produce output signals in a wide range of frequencies.

VCO circuits produce clock signals of varying frequencies in response to variable input voltage signals. VCO circuits are used to generate clock signals in a wide range of circuit applications. VCO circuits are commonly used in transceiver and other communications applications to synchronize clock signals in circuits and devices that communicate with each other. VCO circuitry may, for example, be part of phase-locked loop (PLL) circuitry operative to synchronize the phase and/or frequency of multiple clock signals.

VCO circuits are generally designed to produce output clock signals with frequencies limited to a small range of frequencies. The range of frequencies a particular VCO circuit is operative to produce is typically limited by a tradeoff between the width of the VCO's frequency range and the phase noise at the output of the circuit. VCO circuits requiring minimal phase noise typically have restricted operating frequency ranges, while VCO circuits operative at a wide range of frequencies typically have higher phase noise.

In applications in which VCOs may be required to operate in a wide range of frequencies, such as in VCOs included on programmable logic devices (PLD) which may be required to support multiple different communications standards and frequencies, it may be difficult to provide VCO circuits with low phase noise characteristics over the required frequency range.

It is an objective of the present invention to provide VCO circuits with low phase noise characteristics over a wide range of operating frequencies. It is a further objective of the present invention to provide wide frequency-range VCO circuits that require minimal circuitry.

SUMMARY OF THE INVENTION

In accordance with the principles of the invention, methods and circuits are provided for generating clock signals with a wide range of frequencies and with low phase noise.

Voltage controlled oscillator circuits operative to produce a wide range of output frequencies may include two or more VCO sub-circuits. Each VCO sub-circuit may be optimized to produce output clock signals with low phase noise and with frequencies in complementary ranges. A first VCO sub-circuit may produce output clock signals with frequencies in a first lower range of frequencies. The first VCO sub-circuit may include a gear input operative to select between two modes of operation. A first mode of operation may enable the sub-circuit to produce a lower range of frequencies within the first range of frequencies, while a second mode of operation may enable the sub-circuit to produce a higher range of frequencies within the first range of frequencies. The second VCO sub-circuit may be designed to produce output clock signals with frequencies in a range of frequencies higher than the first range. Additional VCO sub-circuits may be used to extend the range of output signal frequencies the VCO circuit may produce, or to lower the phase noise of the VCO circuit.

VCO circuits in accordance with the principles of the invention may further include control circuitry operative to produce a control signal. The control signal may be coupled to the VCO sub-circuits and may be operative to adjust the frequency of the output signal produced by the VCO sub-circuits. Enable circuitry may selectively activate a single VCO sub-circuit at a time.

Further features of the invention, its nature and various advantages, will be more apparent from the accompanying drawings and the following detailed description.

DETAILED DESCRIPTION

Voltage controlled oscillators (VCO) are used to produce clock signals of varying frequencies. The performance a VCO circuit may be measured in terms of the range of frequencies the VCO circuit may operate at and the phase noise or clock jitter of the VCO output signal. The phase noise or clock jitter is a measure of the variation in the period of clock signals produced by the VCO in response to a constant input signal. The phase noise may be measured as the ratio of the power of the output waveform spectrum at some offset from the peak output frequency to the power of the output waveform spectrum at the peak output frequency. The phase noise is typically measured at a 500 kHz or 1 MHz offset from the peak output frequency.

The performance of a VCO circuit may be influenced by the gain of the VCO. The VCO gain is a measure of the variation in output signal frequency as a function of changes in the input signal amplitude. The VCO gain may be measured in GHz/V (gigahertz per volt), for example. For a given maximum input signal amplitude, circuits with large VCO gains are operative over wider frequency ranges than circuits with low VCO gains. Circuits with large VCO gains, however, may be more sensitive to sources of noise including input signal variations, power supply variations and other sources of noise. Circuits with large VCO gains may therefore have higher phase noise than similar circuits with lower VCO gains. VCO circuits with low VCO gains may be operative over smaller frequency ranges, and may exhibit better phase noise performance.

In addition to phase noise and output signal frequency ranges, VCO performance may be evaluated in terms of power consumption, chip area requirements, power supply rejection ratio, and other known measures of circuit performance.

High performance VCO circuits are designed to have low phase noise (i.e., minimal clock jitter), a wide bandwidth, and low power consumption. However, the design of VCO circuits typically involves the balancing of complementary circuit performance requirements—as improving the performance of a VCO circuit according to one performance criterion generally requires relaxing the performance requirements of the circuit according to another criterion. For example, in order to extend the range of operating frequency of a VCO, it may be necessary to increase the power consumption of the VCO and/or to relax phase noise performance requirements.

Figure 1:
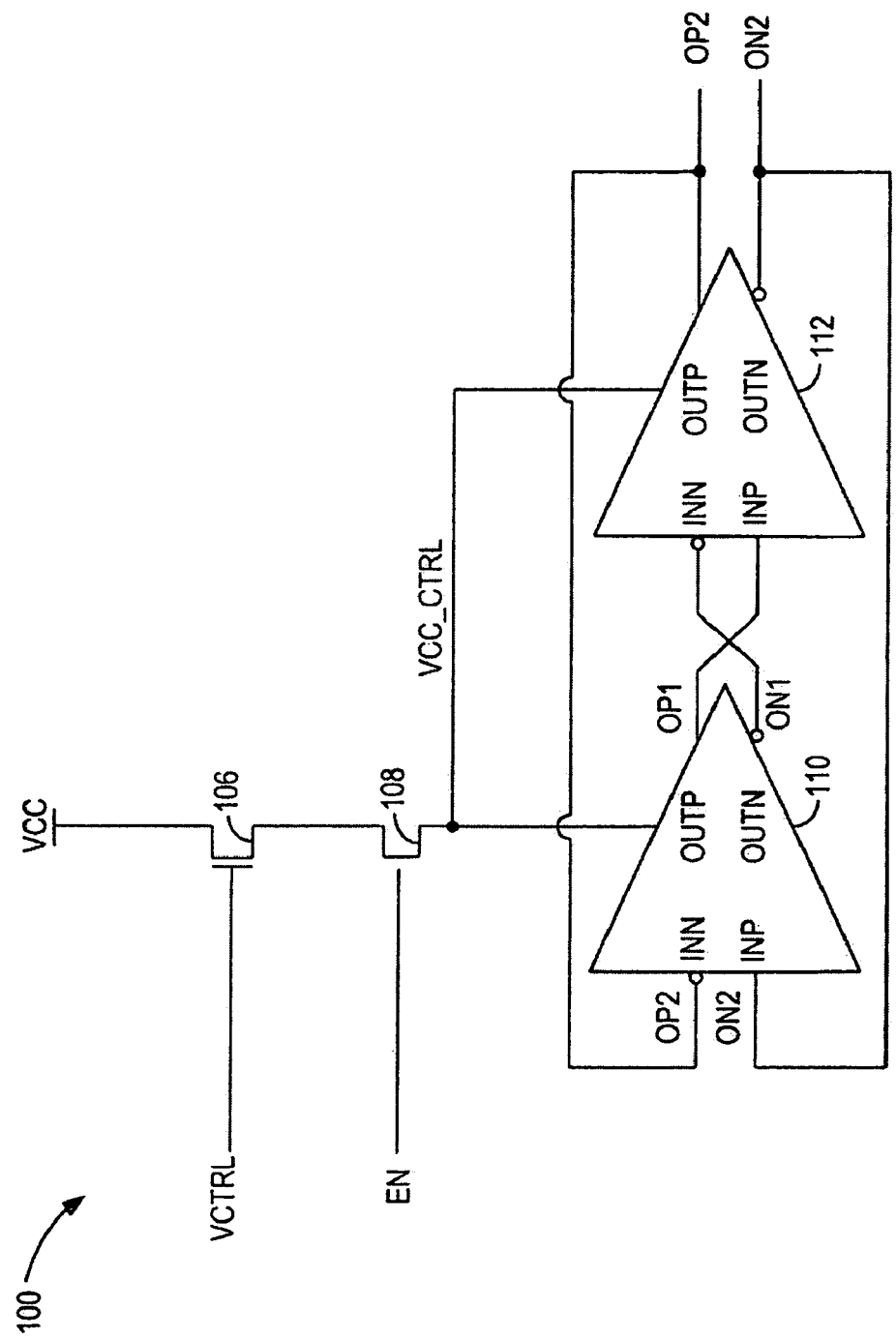
FIG. 1 shows a schematic diagram of a VCO circuit in accordance with the principles of the invention.

FIG. 1 shows a schematic diagram of an illustrative VCO circuit 100 that may be used in accordance with one embodiment of the invention. VCO circuit 100 can include voltage control circuitry 106, enable circuitry 108, and VCO cells 110 and 112. VCO circuit 100 may receive a power supply input VCC, a control voltage input VCTRL, and an enable input EN. VCO circuit 100 may produce VCO output signals OP1, ON1, OP2 and ON2 at the outputs of VCO cells 110 and 112. VCO cells 110 and 112 may be referred to herein as VCO sub-circuits.

The VCC input to VCO circuit 100 may be coupled to a source of voltage providing power for the operation of VCO circuit 100. The VCC input may receive a standard power supply voltage of, for example, 2.5 volts. However, in thin oxide devices or devices with a very small device size such as 90 nm devices, the VCC input may advantageously be coupled to a lower power supply in order to reduce the operating stress on the VCO circuitry. The VCC input may be coupled, for example, to a 1.2 volt supply.

In some embodiments, the VCC input may be coupled to a source of regulated voltage. The use of a regulated voltage source may reduce the power supply noise level and improve the performance of VCO circuit 100. In particular, the reduction of power supply noise may reduce jitter in the output signals produced by VCO circuit 100. Voltage regulation circuitry used to regulate the VCC supply voltage may also serve to reduce the amplitude of the VCC voltage from a standard supply voltage level (e.g., 2.5 volts) to a low supply voltage level (e.g., 1.2 volts). Illustrative voltage regulation circuitry is described in commonly assigned Hoang et al. U.S. patent application Ser. No. 11/437,558, filed May 19, 2006, which is hereby incorporated by reference herein in its entirety.

Voltage control circuitry 106 may be coupled to the power supply VCC, and may be operative to produce a variable voltage level VCC_CTRL in response to a control input VCTRL. The VCC_CTRL may be used as both a power supply voltage and control signal in the operation of VCO cells 110 and 112. Voltage control circuitry 106 may be a transistor or other device operative to produce a variable output voltage level in response to a control input. In the embodiment of circuit 100, control circuitry 106 is a transistor receiving a VCTRL voltage signal at its gate and the regulated VCC voltage at its drain, and operative to produce the VCC_CTRL signal at its source.

Voltage control circuitry 106 is preferably operable to accept a variable control signal VCTRL at its input. Variable control signal VCTRL can be generated by any appropriate circuitry (e.g., a loop filter or phase-frequency detector of a PLL circuit in which VCO circuit 100 resides). By varying the voltage of variable control signal VCTRL, the voltage of variable voltage level VCC_CTRL can be varied. The VCC_CTRL voltage may in turn be operative to control the operation of VCO cells 110 and 112 and to vary the frequency of the signal at the output of VCO circuit 100.

VCO enable circuitry 108 may be coupled in series with voltage control circuitry 106 between the power supply input VCC and the power supply/control signal inputs of VCO cells 110 and 112. VCO enable circuitry 108 may include a switch operative to selectively provide power to the VCC_CTRL input of VCO cells 110 and 112. When the enable input EN at the gate of circuitry 108 is high, circuitry 108 may be operative to provide power to the VCO cells in order to enable their operation. When the EN input is low, circuitry 108 may not provide power to the VCO cells and VCO circuit 100 may be shut off. When the EN input is low, VCO circuit 100 may therefore be insensitive to variations in control signal VCTRL. Enable circuitry 108 may be a transistor or other switch device operative to selectively couple the output of the voltage control circuitry 106 to VCO cells 110 and 112. The enable input EN may be controlled by a VCO input signal, by a configuration RAM bit or other memory element, or by circuitry operative to produce the signal.

One or more VCO cells 110 and 112 may be used to produce a VCO output signal, the frequency of the VCO output signal being related to the VCC_CTRL and/or the input CTRL signals. In the illustrative embodiment shown in FIG. 1, VCO cells 110 and 112 are differential cross-coupled inverters. The non-inverting OP1 and inverting ON1 outputs of cell 110 are respectively coupled to the non-inverting INP and inverting INN inputs of cell 112. The non-inverting OP2 and inverting ON2 outputs of cell 112 are respectively coupled to the inverting INN and non-inverting INP inputs of cell 110. The cross-coupled inverters form a loop circuit that is inherently unstable, and whose output signals oscillate between high and low states at all times.

VCO cells 110 and 112 receive at their power supply input the signal VCC_CTRL. The VCC_CTRL signal serves both as a power supply and a control signal for the VCO cells. The frequency of operation of the VCO circuit, corresponding to the frequency of the signals at the outputs of the VCO cells, is determined by the amplitude of the VCC_CTRL signal. A high voltage level in the VCC_CTRL signal provides increased power to the VCO cells, allowing the cells to switch between output states faster. The VCO cells may be able to change states faster because more current is available to the circuit, allowing the circuit to charge and discharge parasitic and non-parasitic circuit capacitances more rapidly. When the VCC_CTRL has a low amplitude, the VCO may operate more slowly as less current is available to charge/discharge the circuit capacitances in order to switch between output states. Note that the capacitances in the VCO cell and VCO circuits may include non-parasitic capacitances such as integrated circuit capacitors. The frequency of operation of the VCO circuit may be determined by the capacitive loading of the circuit as well as by other factors. For example, the frequency of operation of the VCO circuit may be influenced by the switching speed of transistors, the impedance of the circuitry, the integrated circuit technology used (including process and substrate type, minimum feature size), as well as by other factors.

VCO circuit 100 may be designed to provide output signals with frequencies in any given range. The circuit may be designed to provide output signals in a very wide range of frequencies by designing a circuit with a high VCO gain. Circuits with large VCO gains are generally operative over wide frequency ranges. In another embodiment, VCO circuit 100 may be optimized to operate within a limited range of high frequencies. The VCO circuit may be designed to have minimal parasitic capacitance, for example, in order to allow the signal at the circuit output to rapidly change polarities. In one example, the VCO circuit may be designed to produce output signals with frequencies in the 4.5 to 5.5 GHz range.

In order to design VCO circuits operative to produce output signals with a wide range of frequencies, programmable circuitry may be used. VCO circuits including selectable circuitry operative to vary the output frequency range of operation of VCO circuit 100 may be used. For example, VCO circuits with programmably variable amounts of capacitive loading may be used.

Figure 2:
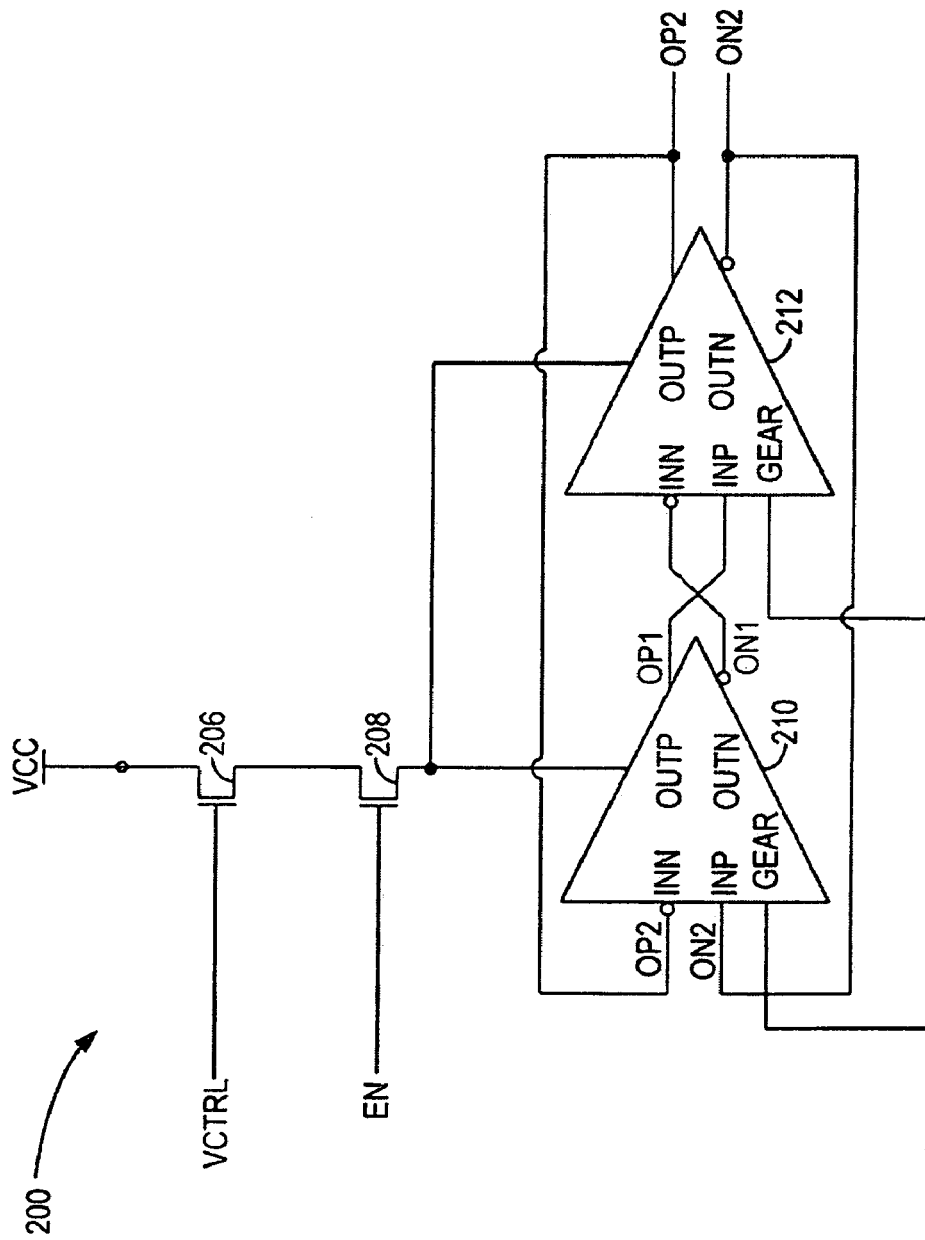
FIG. 2 shows a schematic diagram of another VCO circuit in accordance with the principles of the invention.

FIG. 2 shows a circuit diagram of an illustrative VCO circuit 200 that may be used in accordance with one embodiment of the invention. VCO circuit 200 is similar to VCO circuit 100. Similar input signals, output signals, and circuit elements in VCO circuits 100 and 200 are numbered correspondingly and may operate similarly. In addition to inputs similar to those of circuit 100, VCO circuit 200 includes a GEAR input which may allow circuit 200 to operate with low phase noise over a wider range of frequencies than circuit 100.

The GEAR input of circuit 200 may allow circuit 200 to operate in two different modes, the circuit producing VCO output signals with frequencies in two different ranges depending on the state of the GEAR input. The GEAR input may be used to select between two modes of operation of VCO cells 210 and 212. When the GEAR input is high, VCO cells 210 and 212 may operate in a low frequency range. In the high GEAR mode, additional capacitive loading may be coupled to the output pins of the VCO cells, for example, and may cause the cells to change states relatively slowly.

In one embodiment, VCO cell 210 may be operative to produce output signals with frequencies in the 311 MHz to 1.5 GHz range when in the high GEAR mode, for example. When the GEAR input is low, VCO cells 210 and 212 may operate in a high frequency range. In the low GEAR mode, the additional capacitive loading used in the high GEAR mode may be uncoupled from the VCO cell circuitry, for example, and the cells may be allowed to change states relatively quickly. Circuit 200 may be operative to produce output signals in the 1.5 GHz to 4.5 GHz range when in the low GEAR mode, for example.

The GEAR input of VCO circuit 200 may be controlled by a configuration RAM bit or other memory element operative to control the mode of operation of circuit 200. The GEAR input may also be controlled by a user of circuit 200, by other circuitry such as PLL circuitry used in conjunction with circuit 200, or by other means. The GEAR input may be controlled by the same control circuitry used to operate the enable EN input of circuits 100 and 200.

Figure 3:
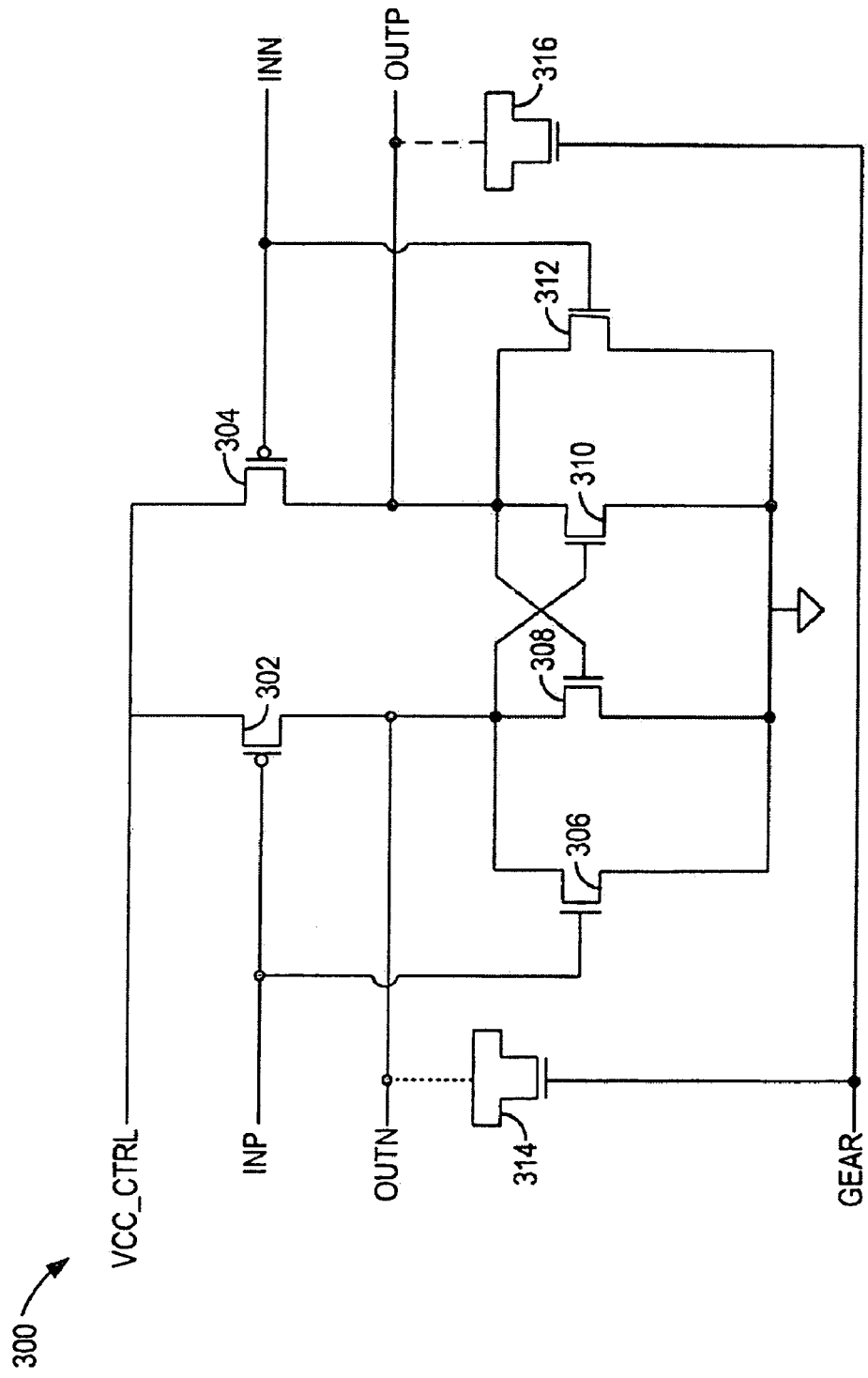
FIG. 3 shows a circuit diagram of a VCO cell circuit in accordance with the principles of the invention.

FIG. 3 shows a circuit diagram of an illustrative VCO cell 300 in accordance with an embodiment of the invention. VCO cell circuit 300 can be used as VCO cell 110, VCO cell 112, or both in VCO circuit 100. VCO cell 300 can also be used as VCO cell 210 and/or 212 of FIG. 2. Other VCO cell circuits may also be used as VCO cells 110, 112, 210, and 212. VCO cell 300 can be operable to receive control input signal VCC_CTRL, whose voltage can vary according to the voltage of a variable control signal (e.g., signal VCTRL in FIGS. 1 and 2). Control input signal VCC_CTRL can supply a pair of inverters with a relatively high voltage. In the illustrative example shown in FIG. 3, a first inverter can include PMOS transistor 302 and NMOS transistor 306, which are coupled in series to each other between control input signal VCC_CTRL and a source of relatively low voltage (e.g., a ground voltage, commonly denoted as "GND"). Similarly, in the illustrative example shown in FIG. 3, a second inverter can include PMOS transistor 304 and NMOS transistor 312, which are coupled in series to each other between control input signal VCC_CTRL and a source of relatively low voltage. The first and second inverters can be coupled in parallel to each other.

The first inverter can be operable to receive input signal INP and generate output signal OUTN, which can have a logical value that is the inverse of the logical value carried by input signal INP. Similarly, the second inverter can be operable to receive input signal INN and generate output signal OUTP, which can have a logical value that is the inverse of the logical value carried by input signal INN. Input signals INP and INN preferably belong to a differential pair of input signals, whose logical value is conveyed by the relative voltages of signals INP and INN. For example, a logical "1" might be indicated by input signal INP carrying a voltage that is substantially higher than the voltage of input signal INN. On the other hand, a logical "0" might be indicated by input signal INP carrying a voltage that is substantially lower than the voltage of input signal INN. Similarly, output signals OUTP and OUTN preferably belong to a differential pair of output signals, whose logical value is conveyed by the relative voltages of signals OUTP and OUTN.

When input control signal VCC_CTRL carries a relatively low voltage (preferably still higher than the relatively low voltage coupled to transistors 306 and 312, e.g., GND), both inverters can switch relatively slowly, resulting in a longer delay through VCO cell 300. In this scenario, the VCO circuit in which VCO cell 300 resides can generate an output signal of relatively low frequency. On the other hand, when input control signal VCC_CTRL carries a relatively high voltage, both inverters can switch relatively quickly, resulting in a shorter delay through VCO cell 300. In this scenario, the VCO circuit in which VCO cell 300 resides can generate an output signal of relatively high frequency.

VCO cell 300 can preferably include NMOS feedforward transistors 308 and 310, which can be cross-coupled to each other as shown in FIG. 3. This NMOS cross-coupling can advantageously conserve circuit area and power consumption relative to full complementary metal oxide semiconductor ("CMOS") cross-coupling, which would also include a pair of cross-coupled PMOS transistors. In addition, employing NMOS cross-coupling instead of full CMOS cross-coupling can advantageously keep the output loading of VCO cell 300 relatively low. Transistors 302, 304, 306, 308, 310, and 312 can be sized to optimize the performance and functionality of VCO cell 300 according to any appropriate criteria. For example, the sizes of these transistors can be chosen in order to ensure that the delay through VCO cell 300 can vary within a desired range in response to varying VCC_CTRL, such that the frequency of output signals OUTN and OUTP can vary within a desired bandwidth.

In some embodiments of the invention, such as in VCO cells 210 and 212 of FIG. 2, VCO cell 300 can include gear transistors 314 and 316. In other embodiments of the invention, such as in VCO cells 110 and 112 of FIG. 1, VCO cell 300 may not include gear transistors. VCO cells operative at high frequencies may not include gear transistors in order to reduce capacitive and other parasitic loading of the circuitry. In embodiments of circuit 300 in which gear transistors are included, gear transistors 314 and 316 may have their drain and source terminals coupled to output leads OUTN and OUTP, respectively. The gates of gear transistors 314 and 316 may be coupled to gear input lead GEAR, as shown. In the example shown in FIG. 3, gear transistors 314 and 316 can be NMOS transistors whose drain and source terminals are coupled to each other.

When gear input signal GEAR is set to a logical "0," both transistors 314 and 316 can enter depletion mode (e.g., be "deactivated"), thereby yielding relatively small capacitive loads on output signals OUTN and OUTP and a relatively short delay for VCO cell 300. Thus, the VCO circuit in which VCO cell 300 resides can generate an output clock signal of relatively high frequency. Viewed another way, varying input control signal VCC_CTRL can vary the frequency of the output clock signal within a relatively wide frequency range. However, using relatively small capacitive loads at gear transistors 314 and 316 can reduce the amount of charging and discharging at output signals OUTN and OUTP and increase circuits' sensitivity to phase noise (e.g., due to flicker noise, wire noise, or thermal noise).

On the other hand, when gear input signal GEAR is set to a logical "1," both transistors 314 and 316 can enter inversion mode (e.g., be "activated"), thereby yielding relatively large capacitive loads on output signals OUTN and OUTP and a relatively long delay for VCO cell 300. Thus, the VCO circuit in which VCO cell 300 resides can generate an output clock signal of relatively low frequency. Viewed another way, varying input control signal VCC_CTRL can vary the frequency of the output clock signal within a relatively narrow frequency range. However, using relatively large capacitive loads at gear transistors 314 and 316 can increase the amount of charging and discharging at output signals OUTN and OUTP, which can make those signals relatively robust to phase noise (e.g., due to flicker noise, wire noise, or thermal noise).

The presence of gear transistors 314 and 316 coupled to the output leads of VCO cell circuit 300 may increase parasitic capacitive loading at the output leads even when the gear transistors are not activated. VCO cells 300 designed for high frequency operation, such as VCO cells 110 and 112 of VCO circuit 100, may therefore not include transistors 314 and 316. VCO cells designed for high frequency operation may further not include a GEAR input.

Figure 4:
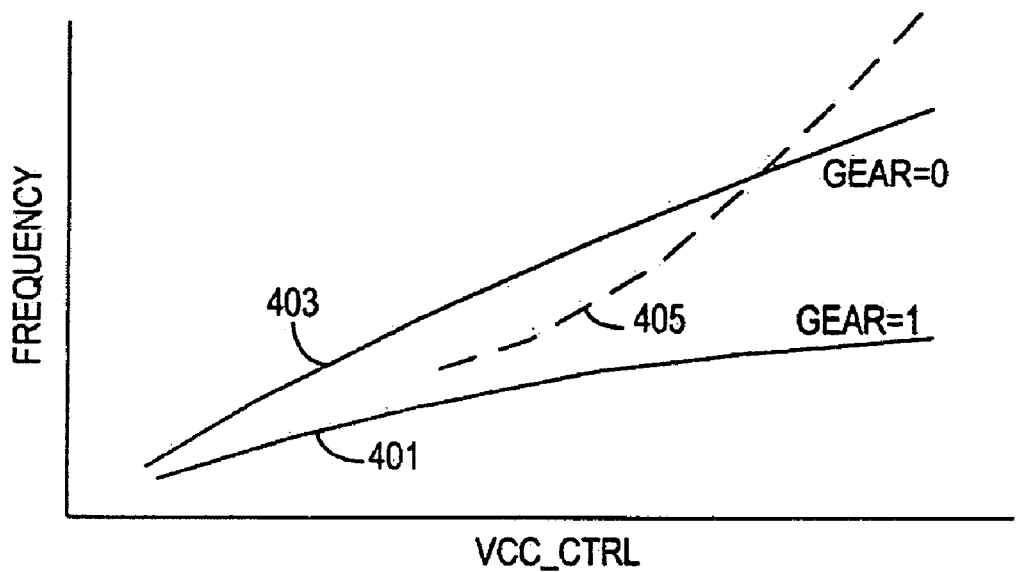
FIG. 4 shows a plot of illustrative frequency responses of VCO circuits in accordance with the principles of the invention.
Figure 5:
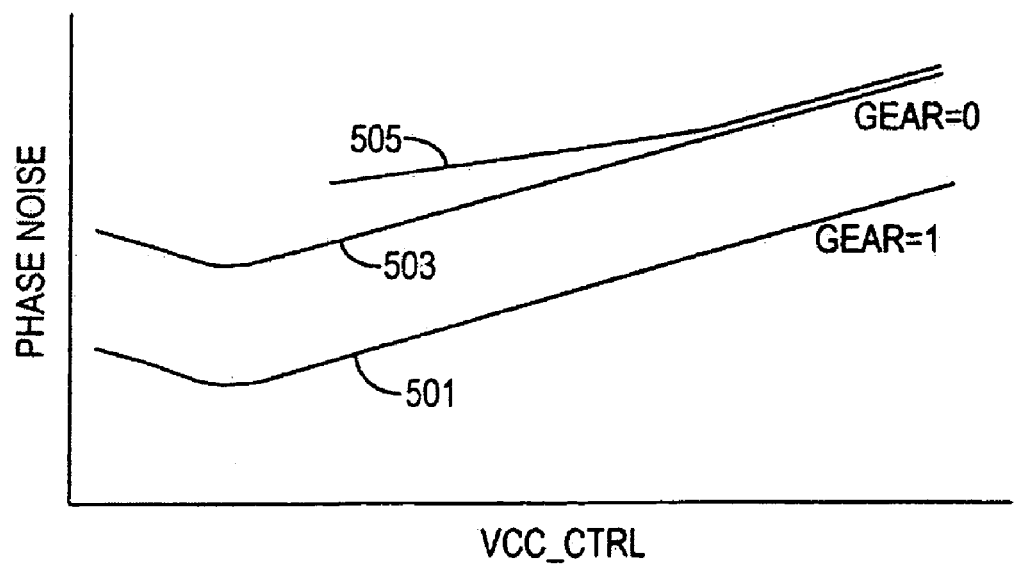
FIG. 5 shows a plot of illustrative phase noise responses of VCO circuits in accordance with the principles of the invention.

FIGS. 4 and 5 show comparative frequency and phase noise responses of VCO circuits such as VCO circuits 100 and 200 of FIGS. 1 and 2. FIG. 4 shows a plot of frequency responses of three VCO circuits as a function of the control voltage VCC_CTRL. For all three circuits, the frequency of the signal at the output of the VCO increases with the VCC_CTRL voltage. Traces 401 and 403 show the frequency response of a VCO circuit such as circuit 200 under high and low gear conditions. Under high GEAR input, VCO circuit 200 operates in a low range of frequencies (trace 401). The frequency of the signal at the output remains low, even for a high value of the VCC_CTRL input. Under low GEAR input, VCO circuit 200 operates in a high range of frequencies (trace 403). In low GEAR mode, the output signal frequency varies over a wider range of frequencies as the VCC_CTRL input increases. Trace 405 shows the frequency response of a VCO circuit such as circuit 100 optimized to have a high VCO gain and to operate at very high frequencies. For high values of VCC_CTRL, trace 405 is above both traces 401 and 403.

The slope of traces 401, 403, and 405 corresponds to the VCO gain of the VCO circuits the traces correspond to. All three traces have relatively constant slopes over the range of VCC_CTRL input control signal and output frequencies shown in FIG. 4, indicating that the circuits have relatively constant VCO gains. The VCO gains of the circuits may vary non-linearly outside of the ranges shown in FIG. 4.

FIG. 5 shows a plot of the phase noise response of three VCO circuits as a function of the control voltage VCC_CTRL. Traces 501, 503, and 505 respectively show the phase noise response of illustrative high GEAR, low GEAR, and high-frequency optimized VCO circuits. The high GEAR trace 501 has the lowest phase noise of the three traces for all values of VCC_CTRL. The high GEAR VCO circuits have low phase noise because of the additional capacitive loading provided by the gear capacitors which act to reduce the sensitivity of the VCO circuits to power supply noise and other sources of noise. The low GEAR trace 503 has higher phase noise than trace 501. The high-frequency optimized VCO circuit (trace 505) has the highest phase noise of the three illustrative circuits shown.

Because of its low phase-noise response, the high GEAR circuit may be advantageously used in applications in which the required VCO output frequency is within the range of frequencies the high GEAR circuit is operative at. In applications in which higher frequencies are required, the low GEAR circuit may be advantageously used as it has an intermediate phase noise level. The high-frequency optimized VCO, because it generally has higher phase noise than both the high and low GEAR VCO circuits, may be used only in applications in which the VCO output frequency required is beyond the maximum frequency of operation of both the high and low GEAR circuits.

In order to take advantage of the different frequency and phase noise characteristics of the high and low GEAR and high-frequency VCO circuits, circuitry may be designed that is operative to switch between the three modes of operation depending on the VCO output frequency requirements.

Figure 6:
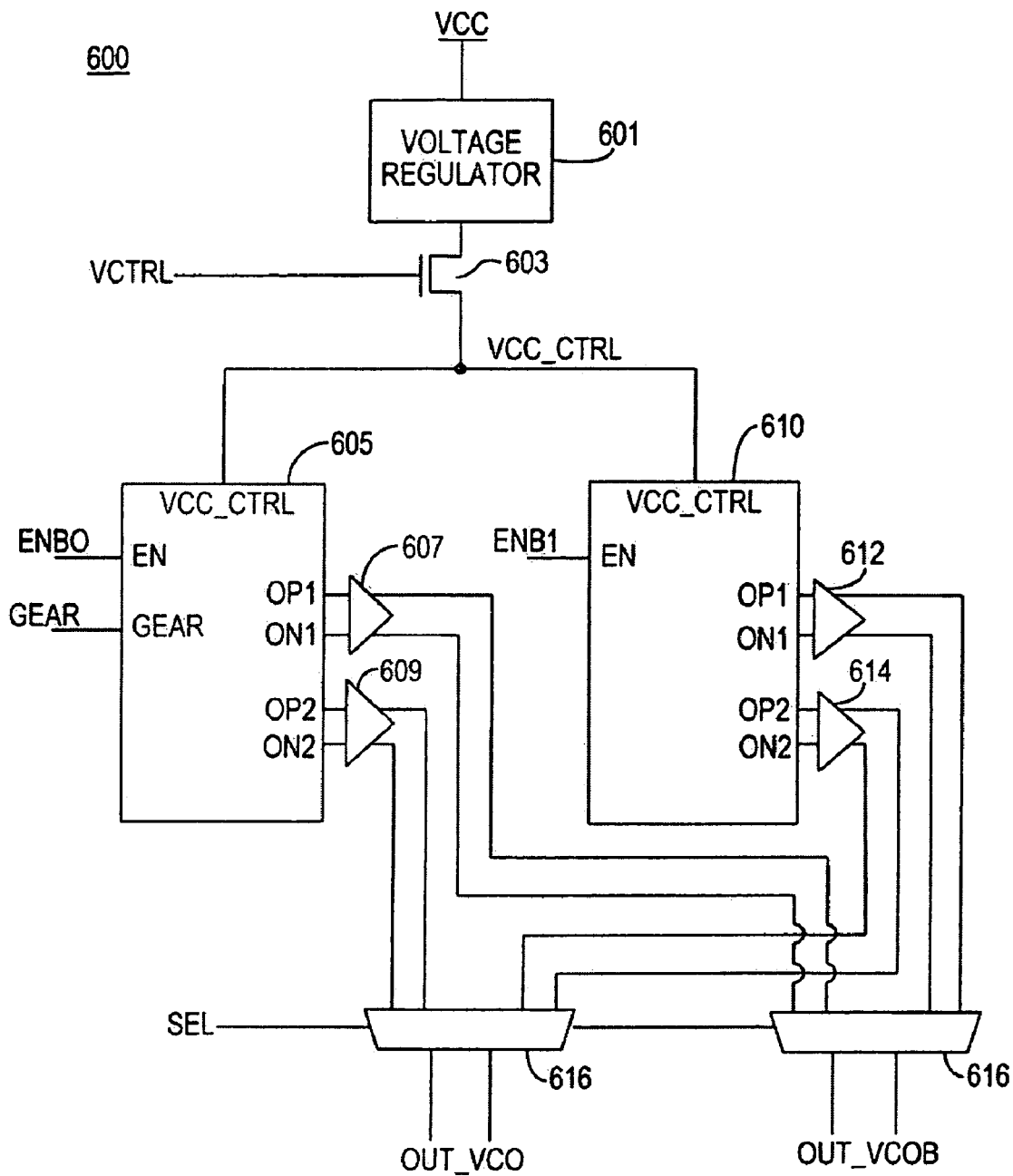
FIG. 6 shows a schematic diagram of a VCO circuit with a wide range of operating frequencies in accordance with the principles of the invention.

FIG. 6 shows a circuit diagram of a VCO circuit 600 which may be designed to have a higher bandwidth and lower phase noise than either of VCO circuits 100 and 200. VCO circuit 600 includes two VCO sub-circuits 605 and 610, as well as voltage regulator circuitry 601, variable voltage control circuitry 603, level-shifter circuitry 607, 609, 612, and 614, and multiplexer circuitry 616. VCO circuit 600 may have a control input VCTRL operative to produce the power supply/control voltage VCC_CTRL provided to VCO sub-circuits 605 and 610. VCO circuit 600 may also have control inputs ENB0, ENB1 and GEAR operative to provide control signals to VCO sub-circuits 605 and 610, and selection input SEL operative to select one or more of the VCO output signals produced by sub-circuits 605 and 610.

VCO circuit 600 includes a first VCO circuit 605 which may be operative to operate on a lower range of frequencies. Circuit 605 may, for example, be optimized to operate with low phase noise in the range of 311 MHz to 4.5 GHz. In an illustrative embodiment, circuit 605 may be a VCO circuit with a GEAR input such as circuit 200 of FIG. 2. Circuit 605 may be operative to operate in a low GEAR mode with very low phase noise when operating in the range of 311 MHz to 2 GHz, for example. Circuit 605 may be operative to operate in a high GEAR mode when operating in the range of 2 GHz to 4.5 GHz, for example. Because of design and process limitations, and because of parasitic capacitive loading cause by GEAR circuitry, circuit 605 may not be operative to operate at frequencies higher than 4.5 GHz. Note that circuit 605 may be similar to VCO circuit 200. However, circuit 605 does not require independent voltage control circuitry 206 as shown in FIG. 2, as circuit 605 receives a control signal at its VCC_CTRL input which is coupled to the output of voltage control circuitry 603.

VCO circuit 600 may include a second VCO circuit 610 designed to operate at frequencies above 4.5 GHz. In one illustrative embodiment, circuit 610 may be a VCO circuit such as circuit 100 of FIG. 1 optimized to be operative at high frequencies. VCO circuit 610 may be designed to have minimal internal capacitance, in order to be operative with minimal phase noise in a narrow frequency range of 4.5 GHz to 5.5 GHz, for example.

Because VCO sub-circuits 605 and 610 include enable inputs ENB0 and ENB1, the sub-circuits can be selectively activated when their operation is required. In particular, the sub-circuits may be enabled independently of the control signal VCC_CTRL being applied to their control input. VCO sub-circuits 605 and 610 may therefore be coupled to the same voltage control circuitry 603 and/or PLL circuitry (not shown) producing a VCO input signal such as signal VCTRL, and be activated only when operation of the sub-circuit is needed. VCO circuit 600 may thus require only a single voltage control circuit 603 and/or a single PLL circuit for producing VCO control signal VCC_CTRL, regardless of the number of sub-circuits 605, 610 being used. While FIG. 6 shows the use of two sub-circuits 605 and 610, more sub-circuits may be used. The use of shared control and/or PLL circuitry may result in a significant reduction in the die area required for fabricating VCO circuitry such as circuit 600 as only a single control and/or PLL circuit may be required to produce control signals for many VCO sub-circuits. The use of shared control and/or PLL circuitry may additionally reduce testing needs and fabrication error rates, and may reduce the time-to-market of VCO circuitry such as circuit 600.

VCO circuit 600 may be optimized to operate over a wide frequency range with minimal phase noise. In the lower frequency range, VCO circuit 600 may activate the low GEAR of VCO circuit 605 in order to produce an output signal with minimal phase noise. When the VCO is required to produce frequencies exceeding the upper limit of the low GEAR of VCO circuit 605, circuit 600 may activate the high GEAR of circuit 605. Finally, when the VCO is required to produce frequencies exceeding the upper limit of VCO circuit 605, high-speed VCO circuit 610 may be activated.

The various modes of operation of VCO circuit 600 may be set by the ENB0, ENB1 and GEAR inputs. When circuit 600 is in operation, only one of enable signals ENB0 and ENB1 may be high in order to activate only one of the VCO sub-circuits 605 and 610. If ENB0 is high and sub-circuit 605 is activated, the GEAR input may be used to select between the low and high GEAR modes of operation. Control circuitry may be operative to select the mode of operation of the VCO circuit by producing ENB0, ENB1 and GEAR signals. Control signals ENB0, ENB1 and GEAR may be set by configuration RAM bits associated with circuit 600. The control signals may alternatively be set by switches or other devices. The control signals may be static signals or dynamic signals.

Level shifters 607, 609, 612, and 614 may be operative to produce rail-to-rail signals at the outputs OUT_VCO and OUT_VCOB of VCO circuit 600. The signals OP and ON at the output of the VCO sub-circuits may have a maximum amplitude equal to the variable amplitude of VCC_CTRL. Level shifters 607, 609, 612, and 614 may be operative to increase the amplitude of the OP and ON signals to a full amplitude equal to the power supply voltage VCC. Level shifters 607, 609, 612, and 614 may be differential op-amps in high gain configurations, for example.

Output multiplexers 616 may be operative to couple the signals at the output of the level shifters to the output nodes OUT_VCO and OUT_VCOB of circuit 600. The SEL input may be operative to select to couple the output nodes to the signals produced by sub-circuit 605, or to the signals at the output of sub-circuit 610.

One particular advantage of VCO circuit 600 is that the circuit requires relatively little circuitry and is operative to produce output clock signals with low phase noise and a wide range of operating frequencies. VCO circuit 600 requires a single voltage control circuit 603, which is operative to control multiple VCO sub-circuits. In the embodiment shown in FIG. 6, voltage control circuit 603 provides a voltage control signal VCC_CTRL to two VCO sub-circuits. However, in other embodiments, voltage control circuit 603 may provide the voltage control signal VCC_CTRL to any number of VCO sub-circuits coupled in parallel. In embodiments in which VCO circuit 600 is used in a PLL circuit, the use of a single voltage control circuit 603 for controlling a large number of VCO sub-circuits may reduce loading on the PLL circuitry.

Figure 7:
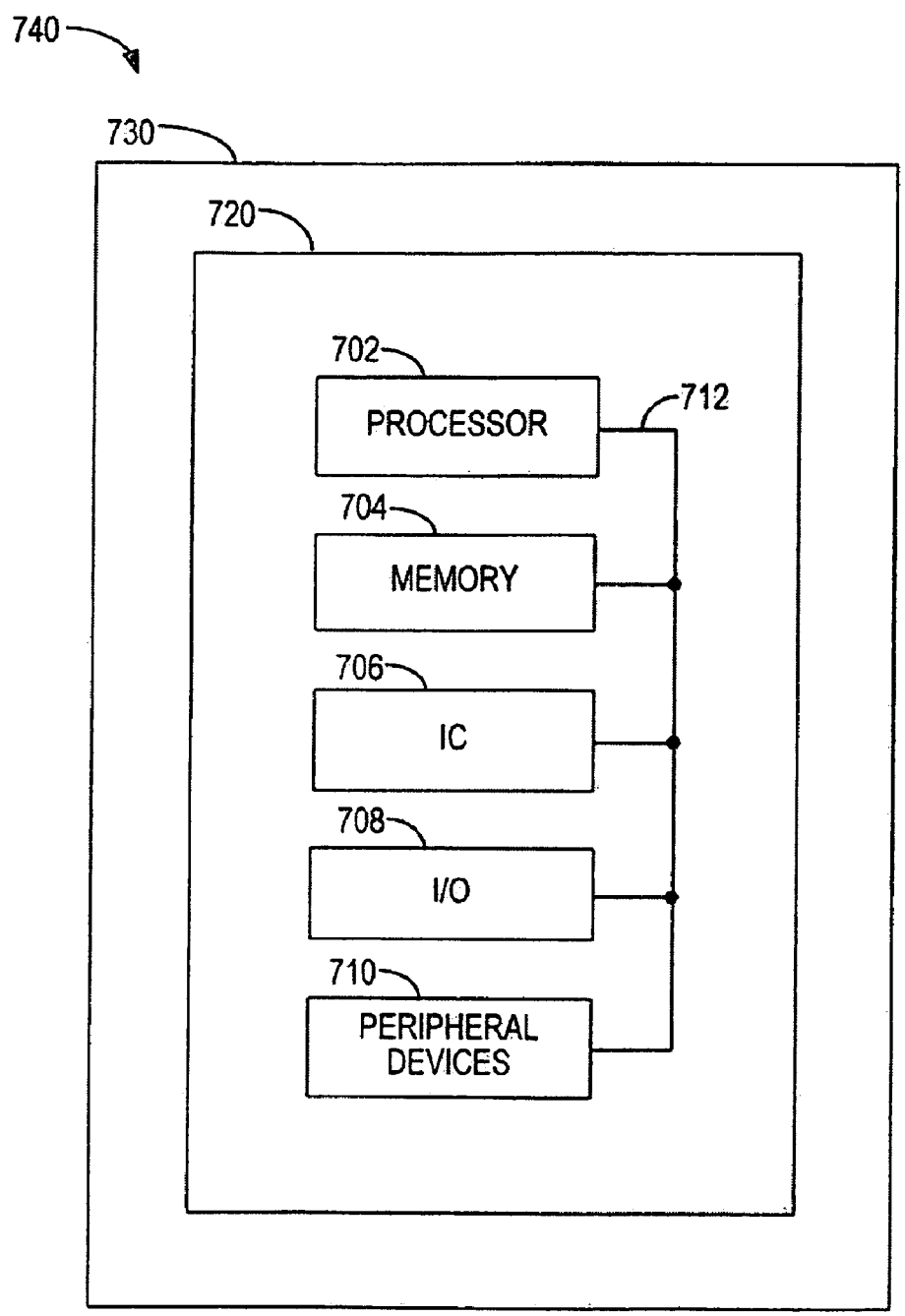
FIG. 7 shows a schematic diagram of an integrated circuit which includes VCO circuitry in accordance with the principles of the invention.

FIG. 7 illustrates an IC 706 which incorporates VCO methods and apparatus in accordance with this invention in a data processing system 740. IC 706 may be a PLD, an application-specific IC ("ASIC"), or a device possessing characteristics of both a PLD and an ASIC. Data processing system 740 may include one or more of the following components: processor 702; memory 704; I/O circuitry 708; and peripheral devices 710. These components are coupled together by a system bus 712 and are populated on a circuit board 720 which is contained in an end-user system 730.

System 740 can be used in a wide variety of applications, such as computer networking, data networking, instrumentation, video processing, or digital signal processing. IC 706 can be used to perform a variety of different logic functions. For example, IC 706 can be configured as a processor or controller that works in cooperation with processor 702. IC 706 may also be used as an arbiter for arbitrating access to a shared resource in system 740. In yet another example, IC 706 can be configured as an interface between processor 702 and one of the other components in system 740.

Methods and circuits are provided for generating a clock signal with relatively high bandwidth and relatively low phase noise. One skilled in the art will appreciate that the invention can be practiced by other than the described embodiments, which are presented for purposes of illustration and not of limitation. The invention is limited only by the claims which follow.

What is claimed is:

1. A voltage controlled oscillator ("VCO") circuit operative to produce an oscillator output signal in response to a variable input signal, the circuit comprising:
    at least two VCO sub-circuits, each VCO sub-circuit operative to produce a clock output signal with a frequency related to an input control signal;
    a control circuit coupled to the at least two VCO sub-circuits and operative to produce the input control signal in response to the variable input signal; and
    enable circuitry operative to selectively activate the at least two VCO sub-circuits, wherein the at least two VCO sub-circuits produce clock output signals of different frequencies in response to the same input control signal.

2. The circuit of claim 1, wherein each VCO sub-circuit comprises two inverters coupled in a series loop.

3. The circuit of claim 1, wherein at least one of the at least two VCO sub-circuits is operative to receive a gear input signal.

4. The circuit of claim 3, wherein the delay of the at least one VCO sub-circuit is based on the input control voltage and the gear input signal.

5. The circuit of claim 3, wherein the range of frequencies of the clock output signal produced by a VCO sub-circuit receiving a gear input signal extends lower than the range of frequencies of the clock output signals produced by other VCO sub-circuits.

6. The circuit of claim 3, wherein at least one of the VCO sub-circuits is not operative to receive a gear input signal.

7. The circuit of claim 6, wherein the range of frequencies of the clock output signal produced by the VCO sub-circuit not operative to receive a gear input signal extends higher than the range of frequencies of the clock output signals produced by other VCO circuits.

8. The circuit of claim 1, further comprising:
    voltage regulator circuitry operative to produce a regulated power supply voltage coupled to the control circuit.

9. An integrated circuit device comprising the circuit of claim 1.

10. A method comprising:
setting a control signal of a voltage-controlled oscillator ("VCO") circuit, wherein said control signal is coupled to control inputs of at least two VCO sub-circuits;
setting an enable signal selectively activating one of the VCO sub-circuits; and
generating an output clock signal at an output of the activated VCO sub-circuit.

11. The method of claim 10, wherein the frequency of said output clock signal is responsive to said control signal.

12. The method of claim 10, further comprising:
setting a gear signal of at least one of said VCO sub-circuits, wherein the frequency of the output clock signal of the VCO sub-circuit having a gear signal is based on said gear signal.

13. The method of claim 10, wherein the range of frequencies of output clock signals generated at the output of the VCO sub-circuit having a gear signal is lower than the range of frequencies of output clock signal generated at the output of another VCO sub-circuit.

14. The method of claim 10, wherein the generating an output clock signal comprises generating an output clock signal at an output of the activated VCO sub-circuit with a frequency related to the control signal.

15. The method of claim 14, wherein the frequencies of output clock signals produced by different VCO sub-circuits are different for any given control signal amplitude.

16. A voltage controlled oscillator ("VCO") circuit comprising:
a voltage control circuit coupled between a source of relatively high voltage and a first voltage control node, the voltage control circuit operative to receive a VCO control signal at its input;
at least two sub-circuits, each sub-circuit coupled between the first voltage control node and a source of relatively low voltage, each sub-circuit comprising:
enable circuitry coupled between the first voltage control node and a second voltage control node, the enable circuitry operative to receive an enable control signal at its input;
at least two cross-coupled inverter circuits, each inverter circuit coupled between the second voltage control node and the source of relatively low voltage.

17. The VCO circuit of claim 16 wherein a VCO output signal is produced at the output of at least one of the cross-coupled inverter circuits, and wherein the frequency of the VCO output signal is related to the amplitude of the VCO control signal.

18. The VCO circuit of claim 16 further comprising:
phase-locked loop circuitry coupled to the input of the voltage control circuit and operative to produce the VCO control signal.

* * * * *